United States Patent [19]

Bate

[11] 4,242,737
[45] Dec. 30, 1980

[54] NON-VOLATILE SEMICONDUCTOR MEMORY ELEMENTS

[75] Inventor: Robert T. Bate, Garland, Tex.

[73] Assignee: Texas Instruments Incorporated, Dallas, Tex.

[21] Appl. No.: 963,855

[22] Filed: Nov. 27, 1978

[51] Int. Cl.³ .............................................. G11C 11/40
[52] U.S. Cl. ...................................... 365/184; 357/54; 365/182
[58] Field of Search ............... 365/118, 174, 182, 184; 357/54

[56] References Cited

U.S. PATENT DOCUMENTS

| | | | |
|---|---|---|---|
| 3,967,310 | 6/1976 | Horiuchi et al. | 357/54 |
| 4,024,562 | 5/1977 | Brown et al. | 357/54 |
| 4,112,507 | 9/1978 | White et al. | 365/184 |
| 4,151,537 | 4/1979 | Goldman et al. | 357/54 |

*Primary Examiner*—Stuart N. Hecker

*Attorney, Agent, or Firm*—William E. Hiller; Melvin Sharp; James T. Comfort

[57] ABSTRACT

The invention is embodied in a non-volatile metal-insulator-semiconductor having a novel combination of insulating layers including a silicon nitride layer covered by a silicon dioxide layer covered by a high dielectric constant insulator. In one embodiment of the invention the nitride layer is directly upon the semiconductor. In another embodiment the insulator combination also includes a second layer of silicon dioxide located between the nitride layer and the semiconductor. Writing is accomplished by injection of charge into the nitride layer and shifting the threshold voltage of the structure. Erasure is accomplished by forcing the injected charge back into the semiconductor to recombine with majority carriers. The charge can be electrons or holes depending on the semiconductor type. The memory element of the invention has lower write/erase voltages, shorter write/erase times and higher writing efficiency.

11 Claims, 12 Drawing Figures

NON-VOLATILE SEMICONDUCTOR MEMORY ELEMENTS

BACKGROUND OF THE INVENTION

This invention is directed to semiconductor memory devices, and more particularly, to a non-volatile metal-insulator-(MIS) memory element having multiple insulating layers.

The earliest semiconductor memories were bipolar, usually transistor-transistor logic (TTL), and were very limited in the number of bits. With the development of the MOS technologies bit density has increased dramatically. At the present time N-channel MOS memories are being fabricated with 16,384 bits of memory per chip. However most of the memory devices available today are volatile, that is they lose the information stored in them when the power to the device is turned off. This disadvantage has led to efforts to create non-volatile semiconductor devices. Several nonvolatile devices have been developed to meet this demand. One of them is described in U.S. Pat. No. 3,660,819. Another is described in U.S. Pat. No. 3,881,180. The MNOS device is another invention which offers a non-volatile memory. Such a device is described in Chang, Proceedings of the IEEE, Vol. 64, No. 7, July 1976, pp. 1039-1059. However all of these devices have various disadvantages. Some of them require exposure to ultraviolet light to erase the information stored in the memory cells. Others are too large for high density designs. The MNOS while offering high density design capability and electrical erasure of stored information requires high write voltages and long write times.

SUMMARY OF THE INVENTION

The invention is embodied in a non-volatile metal-insulator-semiconductor (MIS) memory element having a novel combination of insulating layers. At least three layers are necessary to complete the structure including a silicon nitride layer covered by a silicon dioxide layer covered by a high dielectric constant insulator. In one embodiment of the invention the silicon nitride layer is directly upon the silicon semiconductor. In another embodiment the insulator combination also includes a second layer of silicon dioxide, located between the nitride layer and the semiconductor body to increase charge storage retentivity. Writing into the memory element is accomplished by applying a voltage between the gate and the semiconductor causing minority carriers to tunnel from an inversion layer in the silicon into the silicon nitride and increase the device threshold voltage. The silicon dioxide between the nitride and the titanium dioxide blocks conduction of charge into the titanium dioxide. The charges are trapped in the silicon nitride and at the interface between the nitride and the silicon dioxide barrier. Erasure is accomplished by reversing the voltage applied between the gate and semiconductor causing the carriers to tunnel back into the silicon and recombine with majority carriers. The carriers are electrons with a P-type semiconductor and holes with an N-type semiconductor. The memory element of the invention has lower write voltages, shorter write times and higher writing efficiency.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings wherein:

FIG. 4 is a greatly enlarged view of an area of the section of FIG. 3a;

FIG. 8 is a greatly enlarged view of an area of the section of FIG. 7a.

DETAILED DESCRIPTION OF SPECIFIC EMBODIMENT

Figure 1:
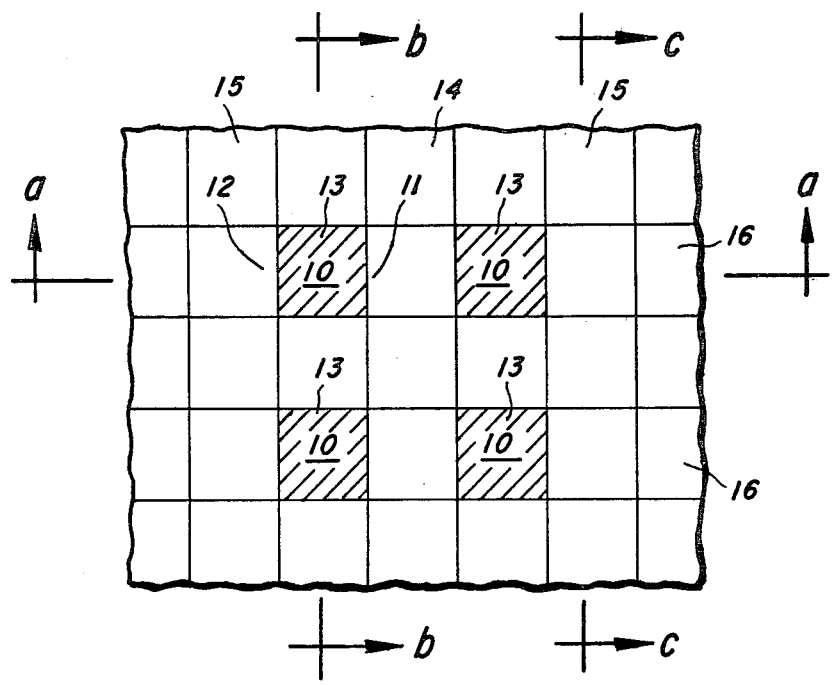
FIG. 1 is a greatly enlarged plan view of a small portion of a semiconductor chip showing the physical layout of an array of RAM cells.
Figure 2:
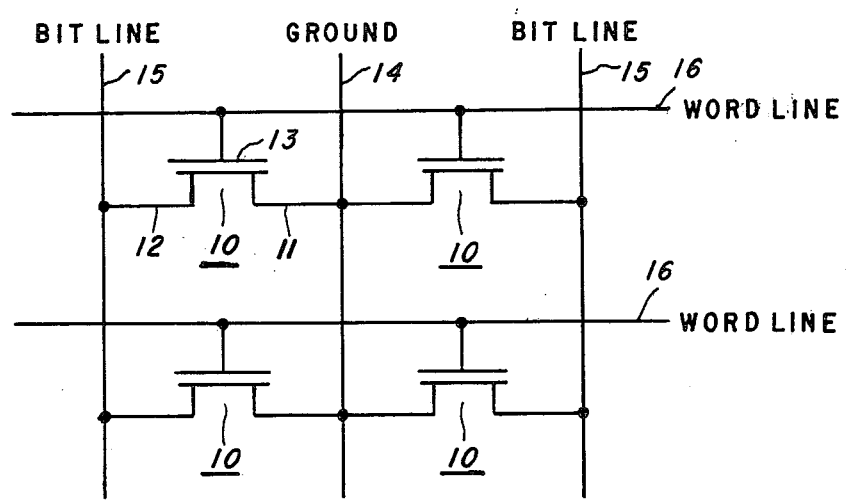
FIG. 2 is an electrical schematic of the RAM array of FIG. 1.
Figure 3A:
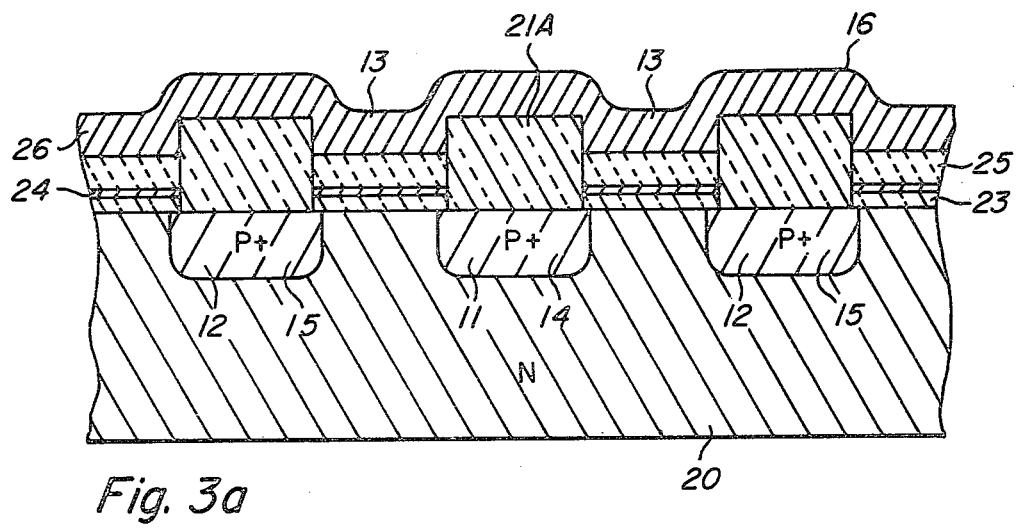
FIGS. 3a-3c are elevation views in section of the cells of FIG. 1, taken along the lines a—a, b—b and c—c respectively.
Figure 3B:
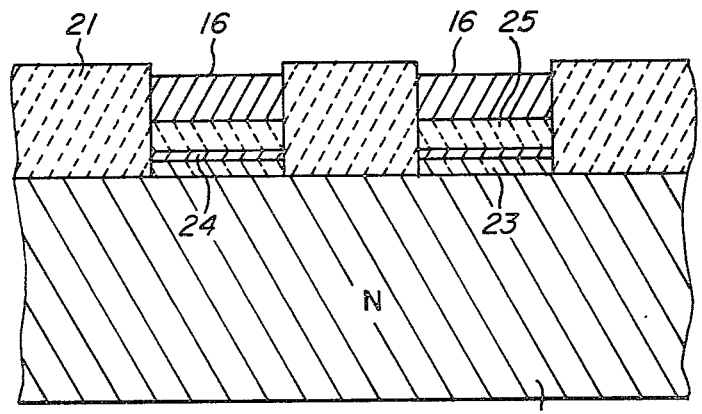
Figure 3C:
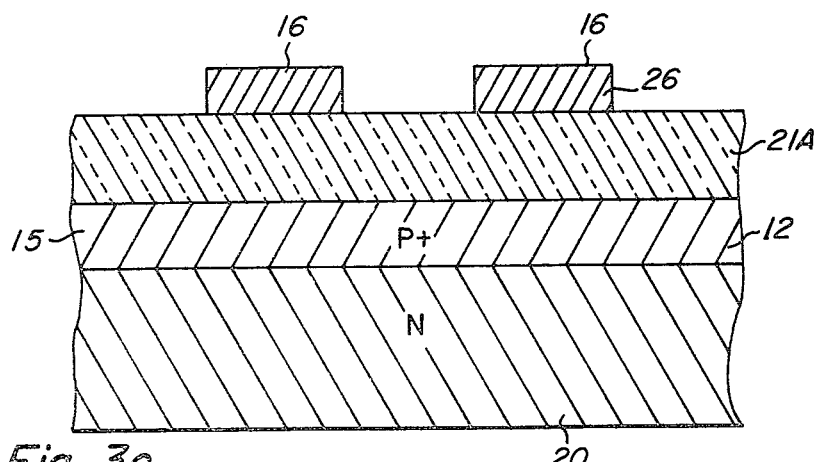
Figure 4:
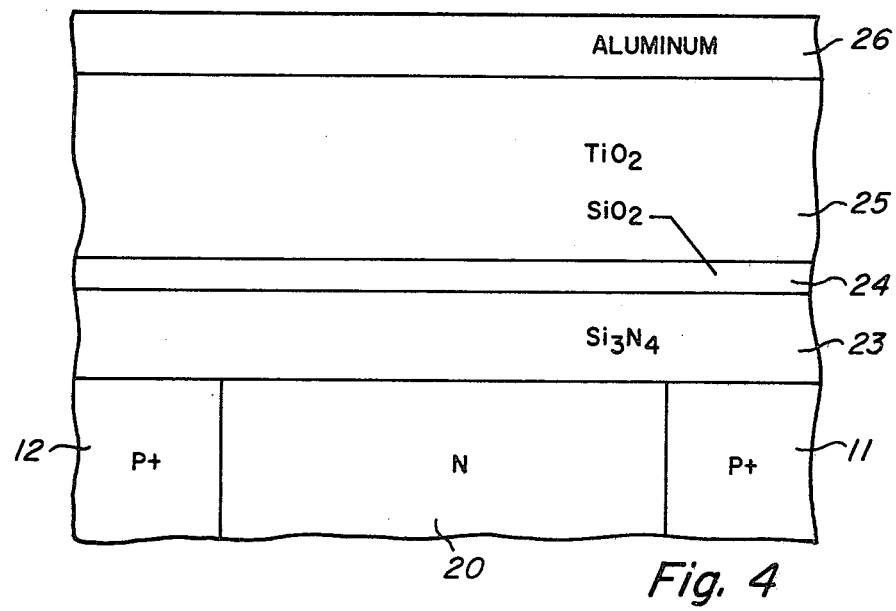
Figure 8:
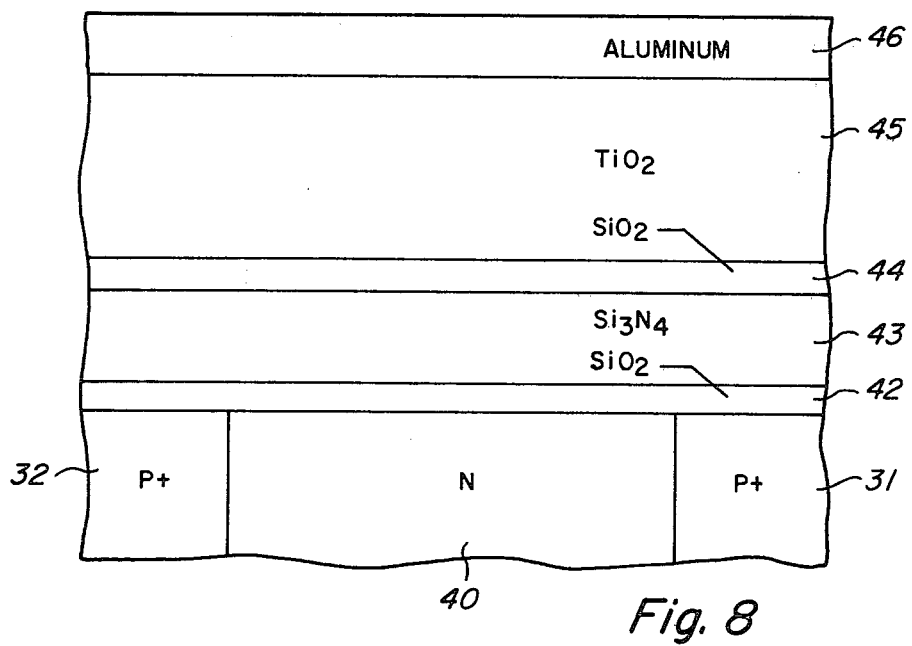

Referring to FIG. 1, a physical layout of an array of RAM cells using the memory element of the invention is shown. The array is of course greatly enlarged in FIG. 1 as each cell would occupy less than 1 square mil. The cell in this embodiment consists of a MOS transistor 10, a word line 16, a bit line 15 and a ground line 14, all of which are also seen in the electrical schematic diagram of FIG. 2.

Referring to FIGS. 3a-3c and 4, sectional views of the memory cells of FIG. 1 show the details of construction. It should be kept in mind when examining the section views that not all geometries, junction depths and layer thicknesses are necessarily to scale, some having been enlarged or reduced where necessary to reflect features of the invention. The transistor 10 has a source 11 which is part of a diffused region forming the ground line 14. A drain region 12 is provided by diffused region which forms a bit line 15. An elongated strip 26 of aluminium forms the transistor gate 13 and is also a word line 16. The gate dielectric is composed of a layer 23 of silicon nitride, a layer 24 of silicon dioxide and a layer 25 of titanium dioxide.

Referring to FIGS. 3a-3c and 4 a process for making the RAM of FIG. 1 is described. The starting slice is N-type monocrystalline silicon perhaps 3 inches in diameter cut on the 100 plane with a resistivity of perhaps 8-10 ohm-cm. The first stage of the process is the formation of the source and drain regions 12, 13. First an oxide layer 21 is grown on the slice by subjecting the slice to a steam ambient in a high temperature furnace tube. Then a layer of photoresist is applied and patterned, removing resist from areas where sources and drains are desired. All patterning techniques used are known and therefore no elaboration will be necessary. The oxide layer not covered with photoresist is removed by subjecting the slice to an oxide etch. The resist is removed and the slice is subjected to a high temperature furnace operation whereby boron is "deposited" in a surface adjacent region in the source and drain areas. The excess doping material is removed and the "deposited" impurities are diffused further into the slice, completing the source and drain formationn, by subjecting the slice to an oxidizing ambient in a high temperature furnace tube. During the diffusion step an oxide layer 21A is grown over the source and drain areas.

The next stage of the process is the formation of the gate dielectric, the key feature of the invention. A layer of photoresist is applied and patterned removing the resist from areas where the gate dielectric is to be formed. The oxide not covered with photoresist is removed by subjecting the slice to an oxide etch. The photoresist is then removed. In this embodiment of the invention care must be taken at this point in the process to prevent the growth of any oxide in the gate dielectric area. Next a layer 23 of silicon nitride is deposited upon the slice by placing the slice in a high temperature chemical vapor deposition (CVD) reactor. The nitride is grown to a thickness of 50–750 Angstroms, preferably 100–200 Angstroms. Then the slice is placed in a high temperature furnace tube and subjected to a steam ambient to convert the top of the layer 23 of silicon nitride to a layer 24 of silicon dioxide. The oxide layer 22 has a thickness of 10–200 Angstroms, preferably 40 Angstroms. This layer 24 of silicon dioxide upon the nitride 23 is the key feature of the dielectric structure. A coating of photo-resist is applied and patterned, leaving photoresist in those areas where titanium is not desired. The slice is then place in an e-gun metal evaporator and a layer of titanium is evaporated upon the slice patterned with photoresist. The titanium is evaporated to a thickness of about 100–3000 Angstroms, preferably 1100 Angstroms. The titanium upon the photoresist is then popped off using conventional techniques. The photoresist is then removed and the slice is subjected to an oxygen ambient in a high temperature furnace tube at about 700 degrees C. for perhaps 2 hours to convert the titanium layer to a layer 25 of titanium dioxide of a form known as rutile. When the titanium is converted to titanium dioxide it increases in thickness by about 77 percent. This completes the formation of the gate dielectric. The formation of titanium dioxide (rutile) upon semiconductors is described in a copending application, METHOD OF DEPOSITING TITANIUM DIOXIDE (RUTILE) AS A GATE DIELECTRIC FOR MIS DEVICE FABRICATION, by Henry B. Morris, Ser. No. 962,259, filed Nov. 20, 1978.

The slice is next subjected to oxide and nitride etchants to remove the part of the converted oxide layer 24 and the nitride layer 23 not covered with titanium dioxide. The device contacts are formed by applying and patterning a layer of photoresist, with resist being removed from areas where the contacts are desired. The oxide not covered with resist is removed by subjecting the slice to an oxide etchant. Then the resist is removed.

The last stage of the process is the formation of the metal interconnects. The slice is placed in a metal evaporator and a layer 26 of aluminum is evaporated upon the slice. A coating of photo-resist is applied and patterned leaving resist where metal interconnects are desired. The areas of aluminum not covered with resist are removed by subjecting the slice to an aluminum etchant. The resist is removed and the slice is subjected to a hydrogen ambient in a high temperature furnace tube to sinter the aluminum interconnects, thereby completing the fabrication process.

Figure 5:
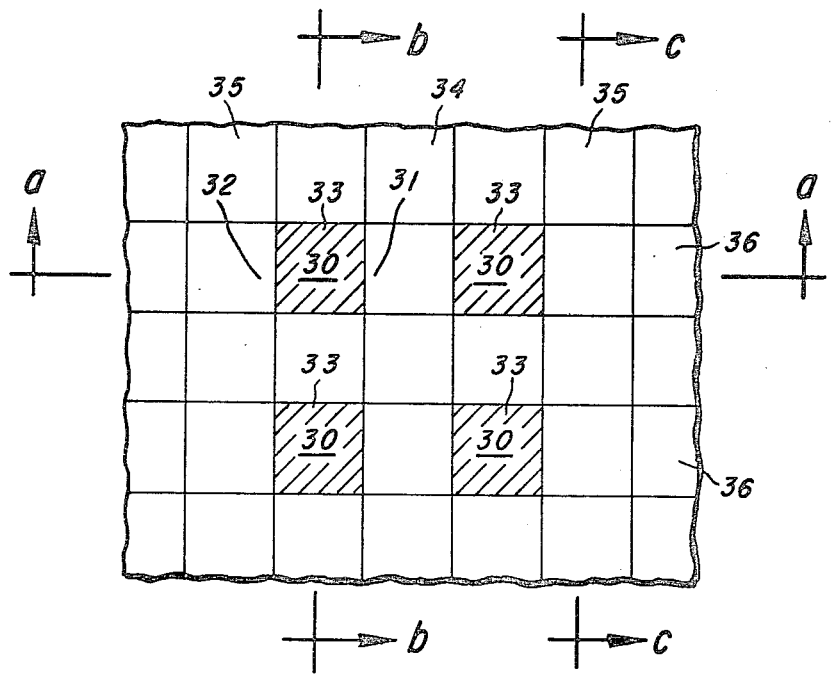
FIG. 5 is a greatly enlarged plan view of a small portion of a semiconductor chip showing the physical layout of an array of RAM cells.
Figure 6:
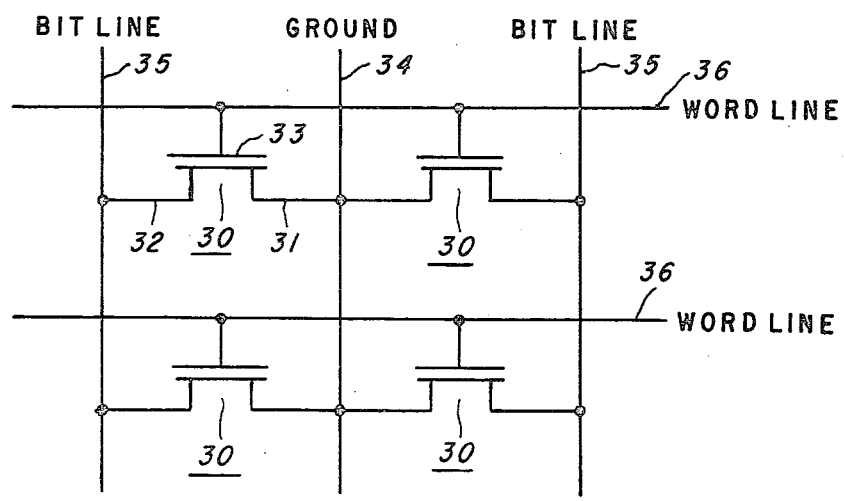
FIG. 6 is an electrical schematic of the RAM array of FIG. 5.
Figure 7A:
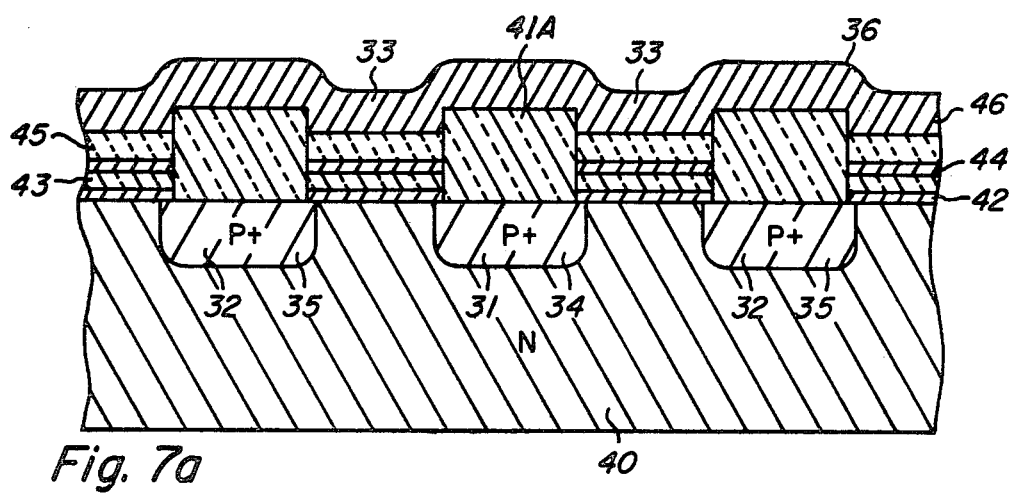
FIGS. 7a-7c are elevation views in section of the cells of FIG. 5, taken along the lines a—a, b—b and c—c respectively.
Figure 7B:
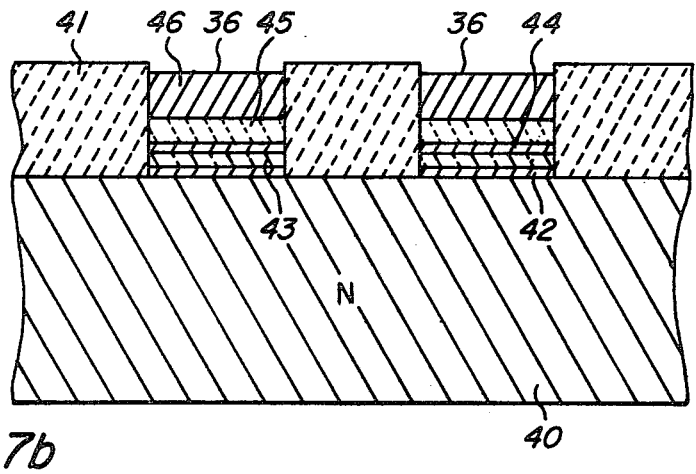
Figure 7C:
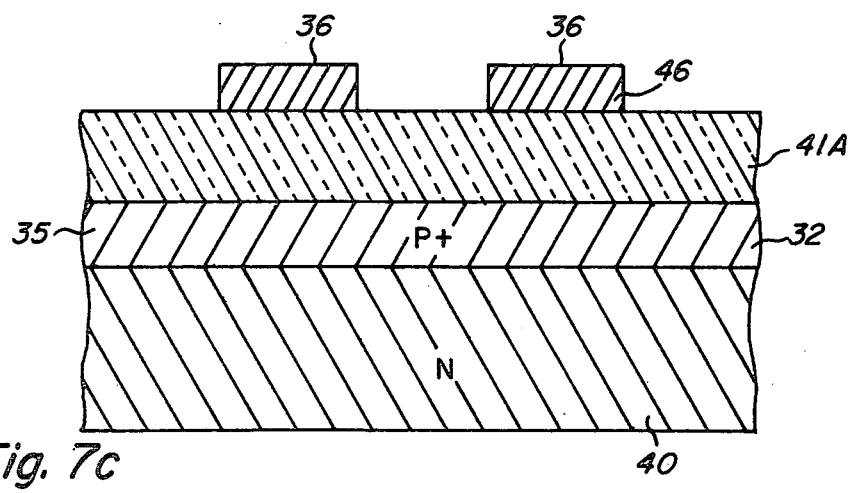

Referring to FIG. 5, a physical layout of an array of RAM cells using a second embodiment of the invention is shown. The array is of course greatly enlarged in FIG. 5 as each cell would occupy less than 1 square mil. The cell in this embodiment consists of a MOS transistor 30, a word line 36, a bit line 35 and a ground line 34, all of which are also seen in the electrical schematic diagram of FIG. 6.

Referring to FIGS. 7a–7c and 8, sectional views of the memory cells of FIG. 5 show the details of construction. The transistor 30 has a source 31 which is part of a diffused region which forms a bit line 35. An elongated strip 46 of aluminum forms the transistor gate 33 and is also a word line 36. The gate dielectric is composed of a layer 42 of silicon dioxide, a layer 43 of silicon nitride, a layer 44 of silicon dioxide and a layer 45 of titanium dioxide.

Referring to FIGS. 7a–7c and 8 a process for making the RAM of FIG. 5 is described. The process for making the device using this embodiment is the same as previously described except at the formation of the gate dielectric. In the previous embodiment care was taken to insure that no oxide layer was formed on the silicon in the gate dielectric area prior to the deposition of silicon nitride. In the embodiment shown in FIGS. 7a–7c and 8 a very thin silicon dioxide layer 42 is desired between the silicon nitride 43 and the silicon 40. This oxide layer 42 can be formed by subjecting the slice to room temperature air for a few minutes or to a boiling hydrogen peroxide/sulfuric acid mixture or hot nitric acid. If a thicker layer is desired the slice can be exposed to an oxidizing ambient in a high temperature furnace tube. Techniques for forming such layers are known and are used in fabricating MNOS devices. The oxide layer 42 has a thickness of 10–150 Angstroms, preferably 20–80 Angstroms. This is the only difference in the two processes.

As previously mentioned the RAM cell uses the memory elements of the invention. The RAM cell here is a simple MOS transistor. To write information into the cell the source (11,31), drain (12,32), and substrate (20,40) are grounded and a negative voltage of about $-10$ volts is applied to the gate (13,33). This causes holes to tunnel from the inversion layer in the substrate (20,40) into the valence band of the silicon nitride (23,43). This tunneling will occur in both embodiments of the invention. Holes will be distributed in the silicon nitride with the greatest density at the interface between the silicon nitride (23,43) and the converted oxide (24,44). The converted oxide layer (24,44), the key feature of the invention, acts as a barrier to the holes and prevents most of them from reaching the titanium dioxide layer (25,45) where they would leak to the gate and ultimately to ground. The placement of these holes in the silicon nitride (23,43) acts to increase the threshold voltage of the transistor (10,30). The threshold voltage is shifted by an amount, usually $-7$ volts, that is larger than the voltage that is applied to the gate during the read operation. A memory cell whose transistor has its threshold voltage shifted, is referred to as having a "1" stored in it. Those memory cells whose transistors have not had their threshold voltages shifted are referred to as having a "0" stored in them.

To read information from the cells the source (11,31) and the substrate are grounded and a negative voltage (about $-5$ volts) is applied to the gate (13,33). A negative voltage is then applied to the drain and the current flow from source to drain is measured. The $-5V$ applied to the gate is greater than the threshold voltage of a transistor which has not had its threshold voltage shifted. Consequently in those cells with a stored "0"

current will flow from source to drain during the read operation. In those cells with a stored "1" no current will flow from source to drain during the read operation.

To erase information in the cells the source (11,31), drain (12,32) and substrate (20,40) are grounded and a positive voltage of about +8 volts is applied to the gate. This causes the holes in the nitride to tunnel back into the silicon and recombine with electrons.

Another of the features of the invention is the use of the titanium dioxide layer (25,45) as part of the gate dielectric. Titanium dioxide of the type formed here has a dielectric constant of approximately 125 which means that when a voltage is applied from the gate (13,33) to the substrate (20,40) very little voltage drop occurs across the titanium dioxide layer (25,45). Most of the voltage drop occurs across the silicon dioxide/silicon nitride/silicon dioxide or silicon nitride/silicon dioxide layers depending on which embodiment is used. Titanium dioxide is not unique in this feature, however since any insulator with approximately the same dielectric constant would give similar results. Zirconium oxide, hafnium oxide and tantalum oxide are examples of high dielectric constant insulators which might be useable instead of titanium dioxide. Silicon dioxide has a dielectric constant of about 3.9, and silicon nitride has a dielectric constant of about 7.0. If either were used in place of the titanium dioxide the write/erase voltages would be similar to those used on MNOS, defeating a main purpose of the invention. Since most of the voltage drop does not occur across the titanium dioxide, voltages lower than those used on similar structures without titanium dioxide can be applied to the structure to write and erase. The use of lower circuit voltages has obvious advantages.

Another advantage of the low voltage drop across titanium dioxide is that write and erase times can be reduced. Although the write/erase voltages are less than half of those used on MNOS devices the electric field strength in the silicon dioxide and the silicon nitride of the dielectric of the present invention during write or erase is more than twice as large as the field strength in the MNOS dielectrics during the same write/erase cycles. Since write/erase time decreases rapidly with increasing field strength the write/erase times are reduced in the present invention.

An advantage of the silicon dioxide layer (24,44) between the silicon nitride (23,43) and the titanium dioxide (25,45) is that writing efficiency is increased. Writing efficiency can be measured as the amount of threshold voltage shift per unit of write time for a constant gate voltage. When carriers tunnel into the silicon nitride layer (23,43) some of them continue through the layer (23,43) and are attracted to the gate. If a carrier reaches the gate (13,33) it has no effect on threshold voltage shift. If carriers of the opposite polarity leave the gate and get trapped in the silicon nitride they will nullify part of the threshold voltage shift due to the carriers tunneling from the silicon. The greater the percentage of tunneling carriers that reach the gate, or carriers of opposite polarity that leave the gate and get trapped in the nitride, the longer the write time must be to achieve a desired threshold shift. Here the silicon dioxide layer (24,44) acts as a barrier to the carriers from the silicon and opposite polarity carriers from the gate thereby increasing the writing efficiency.

This invention has been described with respect to using an MOS transistor as a memory cell but the invention is not so limited. It is possible to use the silicon substrate/gate dielectric/gate structure as the memory cell. Reading whether a "1" or "0" is in the cell can be accomplished by sensing the capacitance of the structure at the read voltage, which will be HIGH or LOW corresponding to accumulation or depletion respectively, depending on whether or not charge is stored in the dielectric. The invention is useful not only for storing holes in the silicon nitride but also for storing electrons. If a P-type substrate is used the device will operate as described if the voltage polarity is reversed. The charge conduction mechanism in this case will be by electrons instead of holes.

While this invention has been described with reference to an illustrative embodiment, it is not intended that this description be construed in a limiting sense. Various modifications of the illustrative embodiment, as well as other embodiments of the invention, will be apparent to persons skilled in the art upon reference to this description. It is therefore contemplated that the appended claims will cover any such modifications of embodiments as fall within the true scope of the invention.

What is claimed is:

1. A memory element comprising:
   a semiconductor body;
   a first layer of silicon dioxide upon said body;
   a layer of silicon nitride upon said silicon dioxide layer;
   a second layer of silicon dioxide upon said nitride layer;
   a layer of titanium dioxide of a form known as rutile upon said second silicon dioxide layer; and
   a conducting layer upon said titanium dioxide layer.

2. An element according to claim 1 wherein said first silicon dioxide layer is less than 150 Angstroms thick.

3. An element according to claim 1 wherein said nitride layer is less than 750 Angstroms thick.

4. An element according to claim 1 wherein said second silicon dioxide layer is less than 125 Angstroms thick.

5. An element according to claim 1 wherein said element includes a pair of spaced doped regions in said body of conductivity type opposite that of said body and wherein said layers are between said pair of regions.

6. A memory cell comprising:
   a memory element;
   a means for writing information into said element;
   a means for reading information from said element;
   a means for erasing information in said element wherein said element includes a semiconductor body, a first layer of silicon dioxide upon said body, a layer of silicon nitride upon said first silicon dioxide layer, a second layer of silicon dioxide upon said nitride layer, a layer of titanium dioxide of a form known as rutile upon said second silicon dioxide layer, and a conducting layer upon said titanium dioxide layer.

7. A memory element comprising:
   a semiconductor body;
   a first layer of silicon dioxide upon said body, said first layer having a thickness less than 150 Å;
   a layer of silicon nitride upon said silicon dioxide layer, said silicon nitride layer having a thickness less than 750 Å;
   a second layer of silicon dioxide upon said nitride layer, said second layer having a thickness less than 125 Å;

an insulating layer upon said second silicon dioxide layer; and a conducting layer upon said insulating layer.

8. An element according to claim 7 wherein said element includes a pair of spaced apart doped regions in said body of conductivity type opposite that of said body and wherein said layers are between said pair of regions.

9. An element according to claim 7 wherein said insulating layer is titanium dioxide of a form known as rutile.

10. An element according to claim 7 wherein said insulating layer is less than 5000 Angstroms thick.

11. An element according to claim 7 wherein said insulating layer has a dielectric constant greater than 15.

* * * * *